United States Patent [19]
Jintate et al.

[11] Patent Number: 5,654,230
[45] Date of Patent: Aug. 5, 1997

[54] METHOD OF FORMING DOPED FILM

[75] Inventors: Shinichi Jintate; Yoshihiko Okamoto, both of Itami; Toshiharu Nishimura; Atsushi Hosaka, both of Tokyo, all of Japan

[73] Assignees: Tokyo Electron Limited; Mitsubishi Denki Kabushiki Kaisha, both of Tokyo, Japan

[21] Appl. No.: 418,841

[22] Filed: Apr. 7, 1995

Related U.S. Application Data

[63] Continuation of Ser. No. 873,170, Apr. 24, 1992, abandoned.

[30] Foreign Application Priority Data

Apr. 25, 1991 [JP] Japan ..................... 3-122707

[51] Int. Cl.$^6$ .................................. H01L 21/22
[52] U.S. Cl. .................. 438/684; 427/583; 427/585; 438/488; 438/925
[58] Field of Search ................... 437/165, 141, 437/101, 233; 148/DIG. 1, DIG. 122; 427/583, 585

[56] References Cited

U.S. PATENT DOCUMENTS

| | | | |
|---|---|---|---|
| 4,745,088 | 5/1988 | Inoue et al. | 437/102 |
| 4,877,753 | 10/1989 | Freeman | 437/101 |
| 4,989,540 | 2/1991 | Fuse | 118/715 |
| 5,116,784 | 5/1992 | Ushikawa | 437/225 |
| 5,198,387 | 3/1993 | Tang | 437/101 |
| 5,250,463 | 10/1993 | Mikata et al. | 437/109 |

FOREIGN PATENT DOCUMENTS 4326512  11/1992  Japan .

OTHER PUBLICATIONS

Sze, VLSI Technology, McGraw–Hill, 1988, pp. 233–237.
Kuehne, In–situ doping and trench–refill with LPCVD polysilicon I. Phosphine/silane ratio as a process–controlling parameter, CA111(24):223013t, 1989.

*Primary Examiner*—Charles L. Bowers, Jr.
*Assistant Examiner*—Ramamohan Rao
*Attorney, Agent, or Firm*—Oblon, Spivak, McClelland, Maier & Neustadt, P.C.

[57] ABSTRACT

A doped film forming method comprising, the steps of preparing gas source for supplying a film forming gas into the process tube, gas source for supplying doping gases, in which a dope is included, into the process tube, a dry pump for exhausting the process tube, and an apparatus for burning a not-reacted element in waste gas, arranging a plurality of substrates in the process tube in such a way that they are separated from their adjacent ones by a certain interval, exhausting the process tube to keep it reduced in pressure, heating the substrates in the process tube to a temperature range of 500°–600° C., controlling amounts of the doping and film forming gases, while exhausting the process tube, at the ratio of the amount of the film forming gas to the amount of the doping gases being in the range of 1 to $1.625\times10^{-3}$ to $2.125\times10^{-3}$, and causing the doping and film forming gases to be reacted with the substrates.

8 Claims, 9 Drawing Sheets

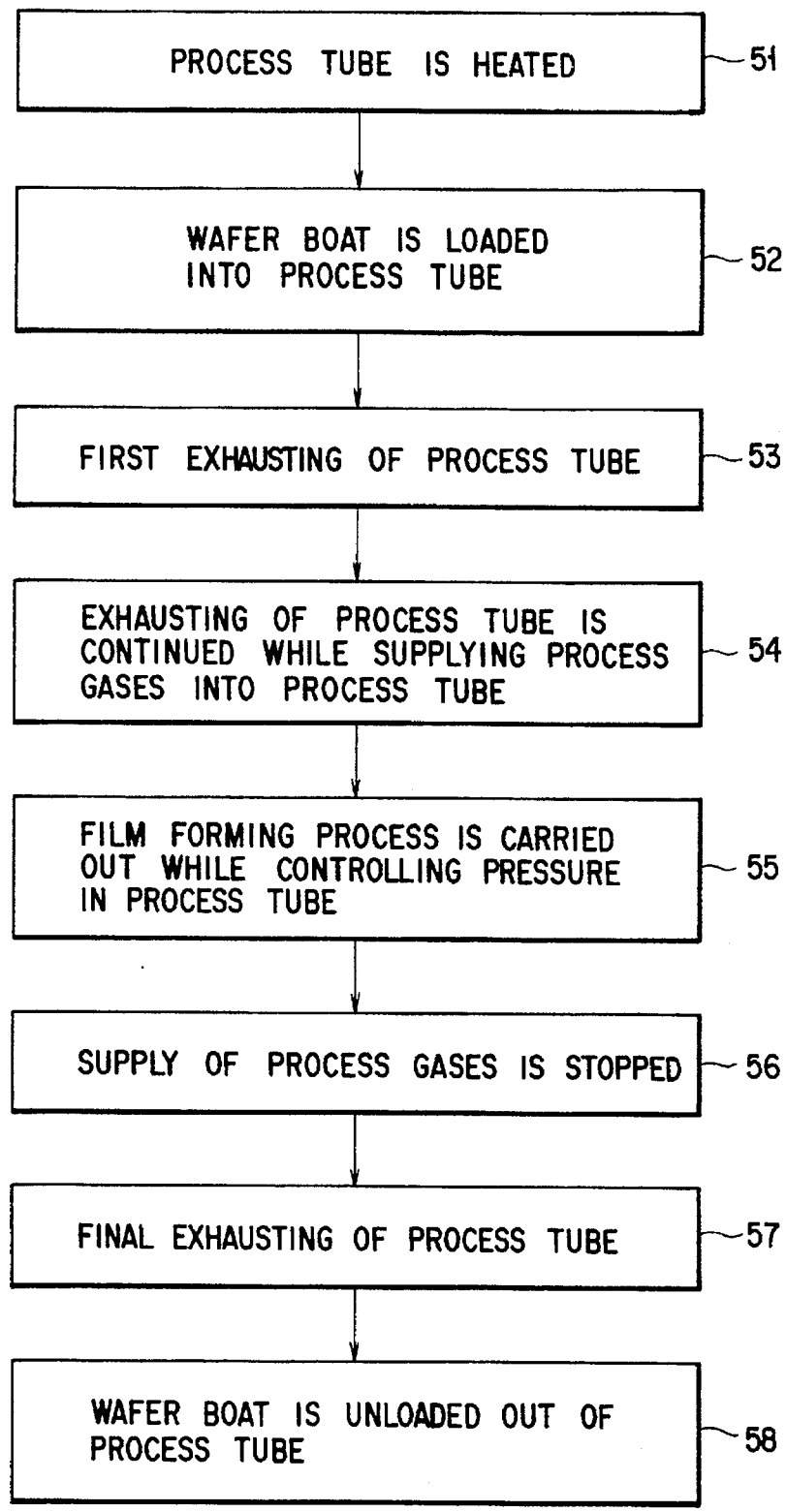
F I G. 2

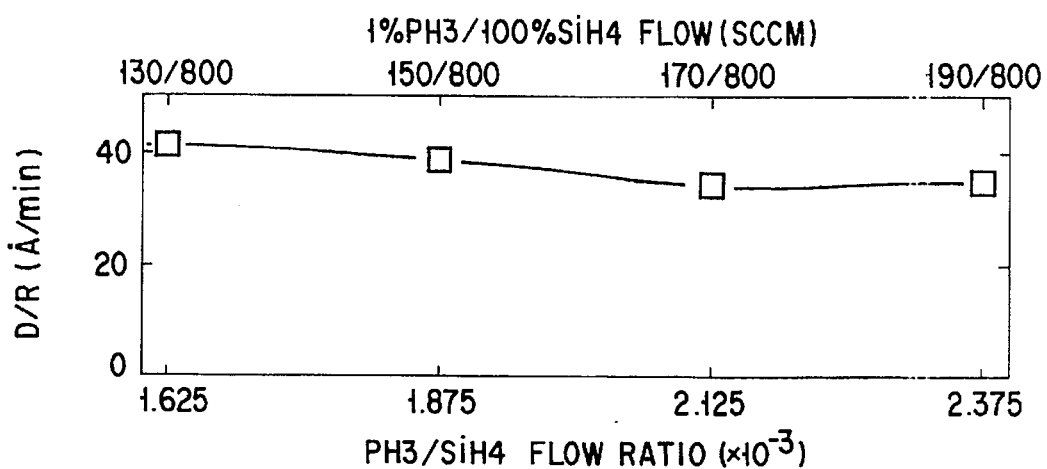
F I G. 3
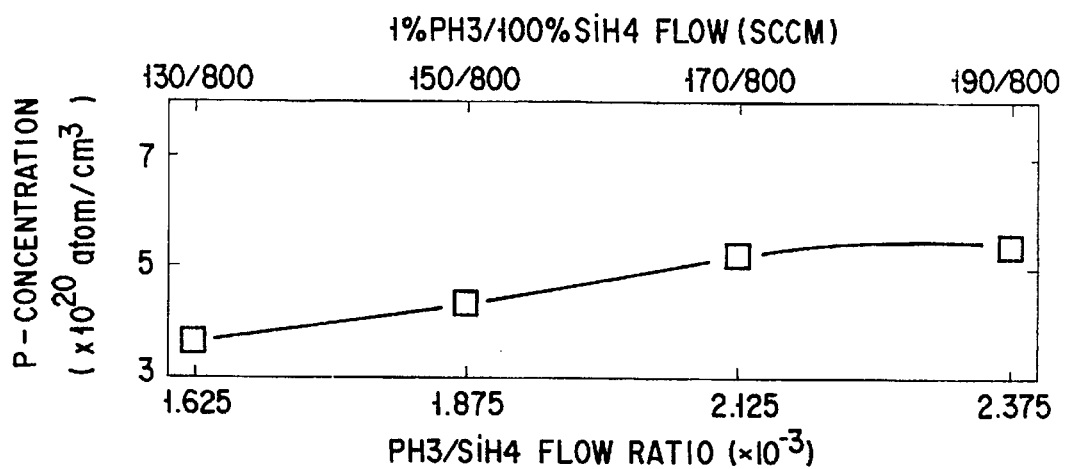
F I G. 4
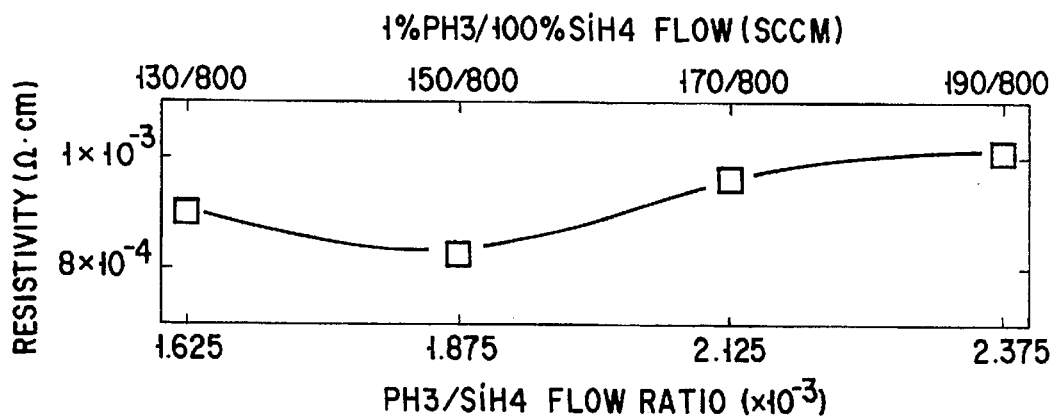
F I G. 5

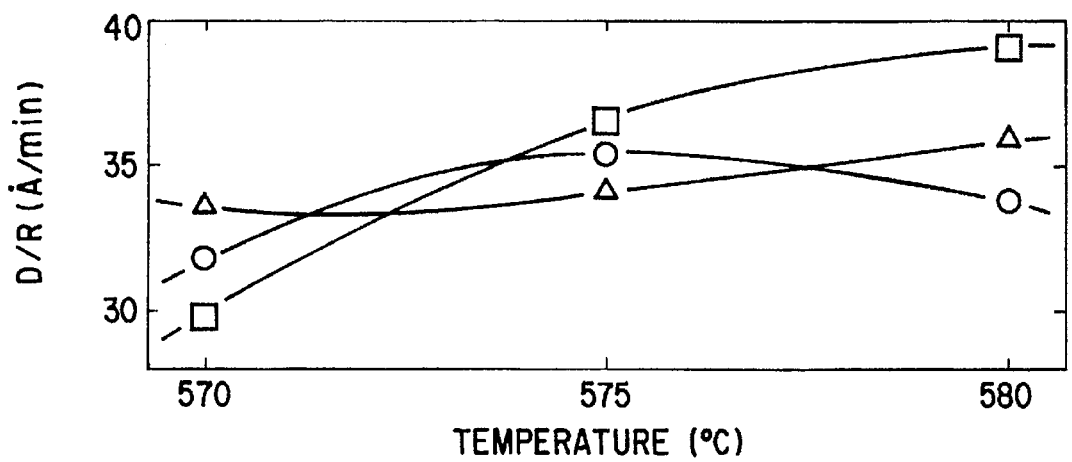
F I G. 6
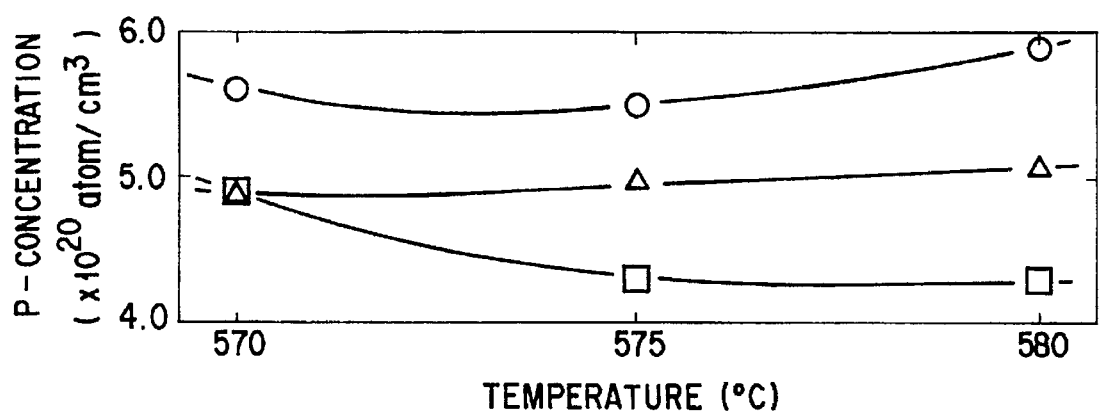
F I G. 7
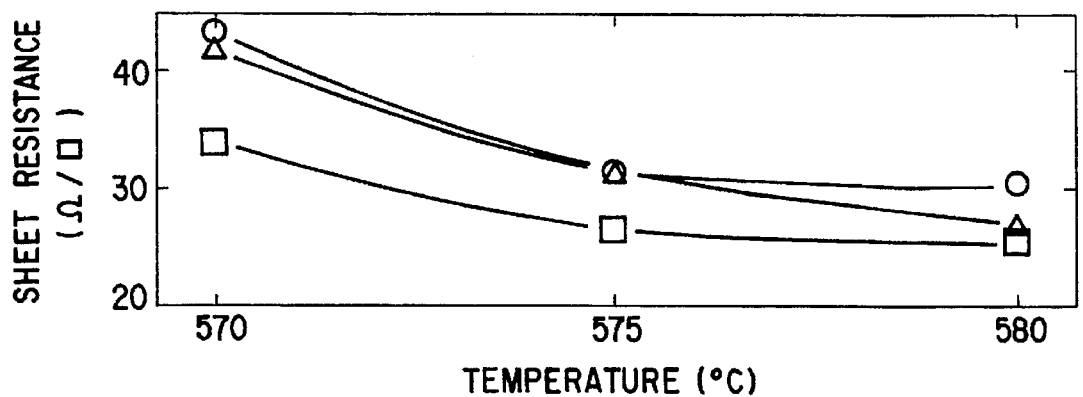
F I G. 8

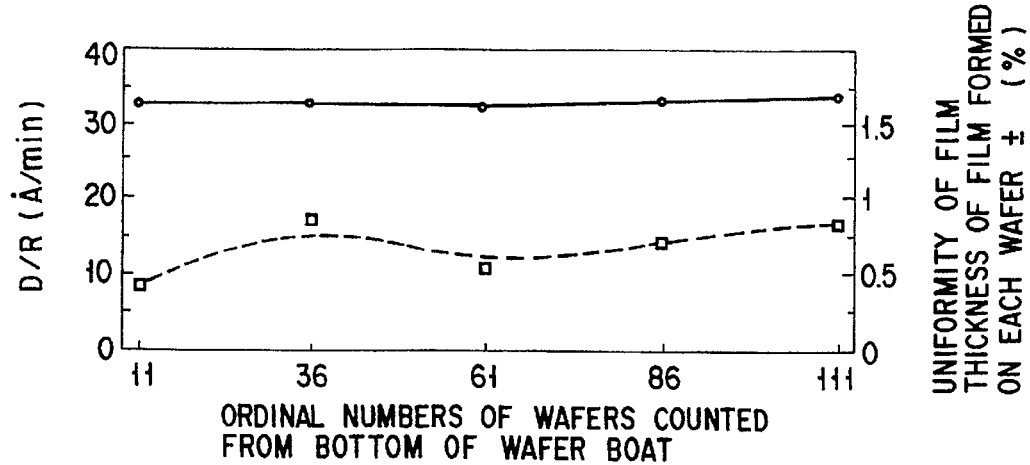
F I G. 12
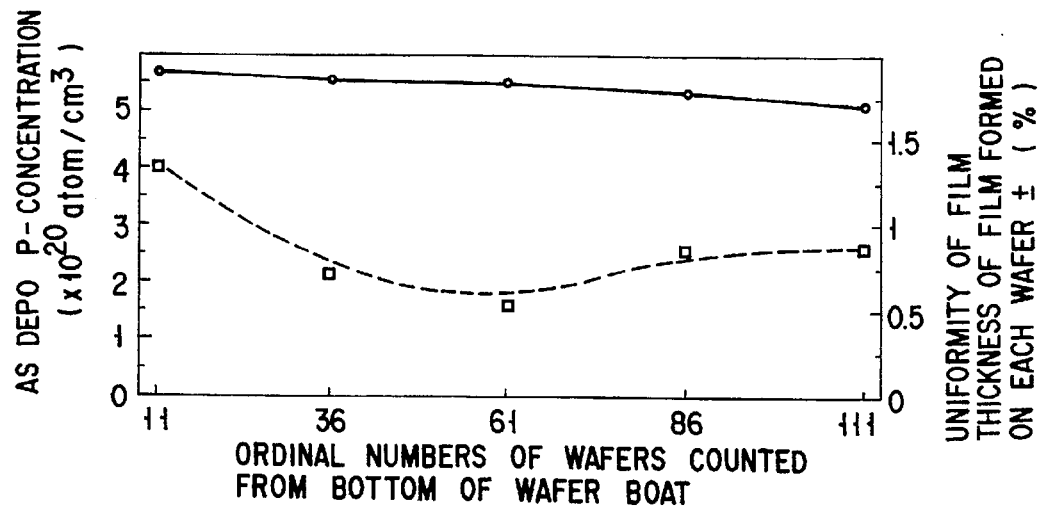
F I G. 13
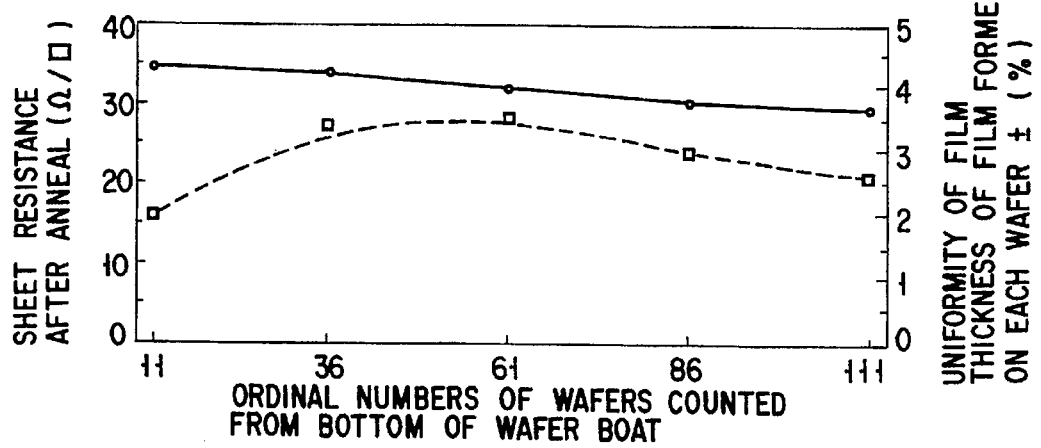
F I G. 14

METHOD OF FORMING DOPED FILM

This application is a Continuation of application Ser. No. 07/873,170, filed on Apr. 24, 1992, now abandoned.

BACKGROUND OF THE INVENTION

1. Field of the Invention

The present invention relates to a method of forming film, in which dopes such as P, B, As and/or Sb are included, on substrates.

In order to make characteristics of IC chips stable (or to cause these IC chips to have desired electric characteristics), it is usually needed that desirable uniform film is formed on semiconductor wafers in the film forming process. It is therefore important in the film forming process that irregularity in film thickness in the surface of each semiconductor wafer is reduced to an extent as greater as possible (which will be hereinafter expressed by that "the uniformity of thickness of the film formed on each wafer is increased"). It is also important that irregularity in film thickness in surfaces of a plurality of batch-processed semiconductor wafers is reduced to an extent as greater as possible (which will be hereinafter expressed by that "the uniformity of the same thickness of films formed on the wafers is increased").

Particularly in a case where doped film is to be formed on a plurality of semiconductor wafers according to the batch processing manner, it is important that irregularity in dope concentrations in films formed on the wafers is reduced to an extent as greater as possible (which will be hereinafter expressed by that "the uniformity of the same dope concentrations in films formed on the wafers is increased").

Further, in order to make the cost lower, it is needed that the throughput at each manufacturing process is enhanced. The film developing speed (or film forming speed), for example, is increased to enhance the throughput at the film forming process.

In a case where mixed gas of diluting phosphine ($PH_3$) and pure silane ($SiH_4$) is used to form P-doped polysilicon film on the wafers, the mixed gas is introduced into the process tube at a flow amount of 100–200 SCCM and reacted with the silicon wafers at a temperature of 600°–630° C. A film forming speed of about 25 Å/min. can be thus achieved. The film forming reaction can be expressed as follows.

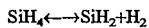

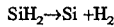

The P-doping gas phosphine is highly reactive. Phosphor is therefore liable to primarily adhere to the surface of each silicon wafer before silane does. The possibility that silane and adhere to the surface of each wafer is thus made low to thereby reduce the throughput. The film forming speed is lowered by 5 Å/min. Further, the uniformity of thickness of the film formed on each wafer is increased by ±25% to thereby lower the productivity of wafers.

In order to increase the uniformity of the same thickness of the film formed on each wafer, it is imagined that the interval between the two adjacent wafers in the process tube is made large enough, but when doing so, the number of wafers which can be batch-processed one time becomes smaller to thereby lower the throughput, too.

Japanese Patent Disclosures Sho 58-108735 and Sho 61-201695 disclose wafer boats of the vertical type in which the film forming process can be carried out so as to provide a high uniformity in the thickness of the film formed on each wafer but without making the interval between the adjacent wafers too large.

In the case of these vertical type wafer boats, however, the ring member for supporting the wafers becomes complicated in shape, thereby making the cost high. In addition, the maintaining of the wafer boats becomes complicated, too. Further, the film forming speed is still left slow. Furthermore, the uniformity of the same thicknesses of films formed on the wafers cannot be increased. The uniformity of the same dope concentrations in films formed on the wafers can be increased neither.

Usually, the film forming temperature may be raised in order to make the film forming speed high. However, the amount of P doped into the thin film is decreased under high process temperature.

Further, when the film forming temperature is lowered while keeping the amount of silane supplied as described above, the film forming speed becomes far lower than the speed practically used.

SUMMARY OF THE INVENTION

The object of the present invention is therefore to provide a doped thin film forming method capable of enhancing thickness uniformity of the film formed on each wafer, of the same thicknesses of films formed on the wafers and of the same dope concentrations in films formed on the wafers higher than their desired levels and also capable of increasing the film forming speed.

Many things are still left unclear relating to the film forming reaction which develops in the process tube. Further, various factors related to temperature, concentration and volume are complicatedly tangled with one another. This makes it quite difficult to find out those conditions under which the film forming process can be most suitably carried out. Inventors of the present invention repeated try and error, variously changing the combination of flow rates of film forming and doping gases, temperature, the number of wafers batch-processed, and reaction time. We inventors have finally succeeded in finding out the following optimum conditions. The "film forming gas" used below will represent a gas including a component deposited on substrates. The "doping gases" also used below will denote a gas including a dope which is deposited, as an impurity, into the film deposited.

According to an aspect of the present invention, there can be provided a doped film forming method carried out in a heat processing apparatus comprising process tube, a means for supplying a film forming gas into the process tube, means for supplying doping gases, in which a dope is included, into the process tube, a pump means for exhausting the process tube, and a means for burning a not-reacted component in waste gas, said method comprising arranging a plurality of substrates in the process tube in such a way that they are separated from their adjacent ones by a certain interval; exhausting the process tube to keep it reduced in pressure; heating the substrates in the process tube to a temperature range of 500°–600° C.; controlling amounts of the doping and film forming gases, respectively, while exhausting in the process tube, at the ratio of the amount of the doping gases to the amount of the film forming gas ranging between $1.625 \times 10^{-3}$ to $2.125 \times 10^{-3}$, and causing the doping and film forming gases to be reacted with the substrates.

According to another aspect of the present invention, there can be provided a doped thin film forming method comprising arranging a plurality of substrates in a process tube in such a way that they are separated from their adjacent ones by a certain interval; exhausting the process tube to keep it reduced in pressure; heating the substrates in the process tube to a temperature range of 500°–600° C.; controlling amounts of doping and film forming gases, respectively, while exhausting the process tube, at the ratio of the amount of the doping gases to the amount of the film forming gas ranging between $1.625 \times 10^{-3}$ to $2.125 \times 10^{-3}$ and that the film forming gas of 48–807 $SCCM/m^2$ is supplied to a unit surface area of each substrate; and reacting the doping and film forming gases with the substrates.

In order to form the films or the surfaces of 170 sheets of 6-inch wafers, it is necessary to supply 300–5000 SCCM of the film-forming gas. The supply amount thereof at the unit of area of wafer will be 48–807 $SCCM/m^2$.

A wafer boat in which a plurality of semiconductor wafers are housed at a predetermined interval is loaded into a process tube and temperature in the process tube is set lower than the common reaction temperature or a certain value in a range of 500°–600° C., for example. The process tube is exhausted by a dry pump to keep pressure in the process tube at such a value that allows the common pressure-reduced CVD process to be carried out in the process tube. A large amount of silane, for example, is then supplied, as film forming gas, into the process tube at such a certain value that is in a range of 300–5000 SCCM, for example. On the other hand, a certain amount of phosphine or helium diluting phosphine, 10% in concentration, is supplied, as doping gas, into the process tube. When silane is reacted with the semiconductor wafers for a certain time period in this manner, the film forming speed, uniformities of thickness of the film formed on each wafer and of the same thicknesses of films formed on the wafers can be enhanced. In addition, uniformities of the same dope concentration in the film formed on each wafer and of dope concentrations in films formed on the wafers can also be enhanced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a flow chart showing how the film forming method is carried out;

FIG. 3 is a graph showing how the film forming speed is influenced when the flow rate of phosphine relative to that of silane is variously changed;

FIG. 4 is a graph showing how P-density in film formed is influenced when the flow rate of phosphine relative to that of silane is variously changed;

FIG. 5 is a graph showing how the resistivity (Ω.cm) of film formed is influenced when the flow rate of phosphine relative to that of silane is variously changed;

FIG. 6 is a graph showing how the film forming speed is influenced when the processing temperature is variously changed;

FIG. 7 is a graph showing how P-density in film formed is influenced when the processing temperature is variously changed;

FIG. 8 is a graph showing how the sheet resistance (Ω/□) of film formed is influenced when the processing temperature is variously changed;

FIG. 12 is a graph showing how one of film characteristics and uniformity of the same thicknesses of films formed on wafers when P-added polysilicon film is to be formed;

FIG. 13 is a graph showing how another of film characteristics and uniformity of the same thicknesses of films formed on wafers when P-added polysilicon film is to be formed;

FIG. 14 is a graph showing how the other of film characteristics and film uniformity of the same thicknesses of films formed on wafers when P-added polysilicon film is to be formed.

DETAILED DESCRIPTION OF THE PREFERRED EMBODIMENTS

Various embodiments of the present invention will be described referring to the accompanying drawings. A case where polysilicon film is formed on 170 sheets of 6-inch silicon wafers in the pressure-reduced CVD apparatus will be described as a first embodiment of the present invention.

Figure 1:
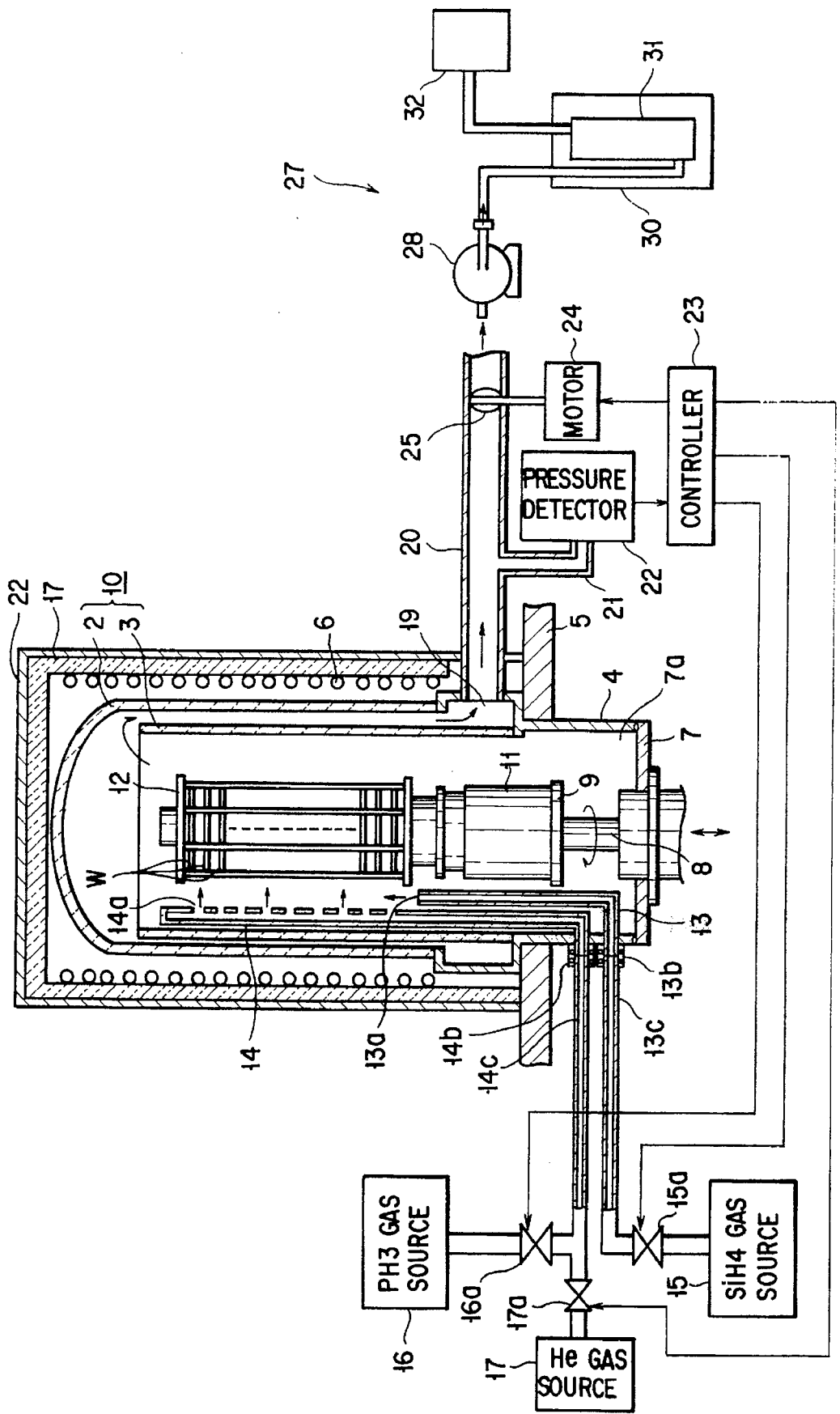
FIG. 1 is a vertically-sectioned view showing a CVD apparatus of the vertical type used for carrying out the film forming method according to an embodiment of the present invention.

As shown in FIG. 1, the pressure-reduced CVD apparatus has a process tube 10 into and out of which a wafer boat 12 of the vertical type is loaded and unloaded. The process tube 10 is an concentrically-arranged double tube comprising outer and inner cylinders 2 and 3. The outer cylinder 2 is closed at its top but opened at its bottom. The inner cylinder 3 is opened at its top and bottom. Both of the process tube 10 and the boat 12 are made of quartz.

A stainless steel-made manifold 4 is attached to bottoms of the outer and inner cylinders 2 and 3. The manifold 4 is fixed to a base plate 5. Heaters 6 each comprising a resistance heating element encloses the process tube 10.

The heaters 6 are enclosed by an insulating layer 17 made by silica blocks to keep the process tube 10 hot. The insulating layer 17 is enclosed by a case 22 made of stainless steel.

The open bottom of the manifold 4 is air-tightly sealed by a cap 7 made of stainless steel through an O-ring 7a.

A rotating shaft 8 is passed through the cap 7 substantially at the center thereof. A magnetic seal system (not shown) is interposed between the rotating shaft 8 and the cap 7. The rotating shaft 8 is connected to a drive system (not shown)

at the lower end thereof and fixed to a turntable 9, made of stain-less steel, at the upper end thereof.

An insulating sleeve 11 made of quartz is mounted on the turntable 9. The outer circumference of the insulating sleeve 11 is separated from that of the inner cylinder 3 by a certain distance. 100 sheets, for example, of silicon wafers W are housed in the wafer boat 12 at a certain pitch. The wafer W is separated from its adjacent one by 4.76 mm, for example, when they are measured from the top face of one of them to the bottom face of the other.

The wafer boat 12, the insulating sleeve 11, the turntable 9 and the cap 7 are loaded and unloaded, as a unit, into and out of the process tube 10 by an elevator system (not shown).

Gas pipes 13 and 14 are introduced into the inner cylinder 3 of the process tube 10, passing through the side wall of the manifold 4 and extending upward along the inner circumference of the inner cylinder 3.

The first gas pipe 13 is communicated with an $SiH_4$ gas supply source 15 at a base portion 13c thereof and opened at the top of a front end portion 13a thereof, terminating in the middle of the inner cylinder 3. The front end portion 13a of the first gas pipe 13 is made of quartz and the base end portion 13c thereof of stainless steel. The first gas pipe 13 is passed through the side wall of the manifold 4 via a seal member 13b.

The second gas pipe 14 communicated with $Ph_3$ and helium gas supply sources 16 and 17 at a base portion 14c thereof. It is provided with a plurality of outlet holes 14a which are formed along its front end portion at a certain pitch. All of these outlet holes 14a are opened, facing the wafer boat 12. In other words, they are arranged to allow phosphine gas to pass through them, flowing parallel to the surface of every of the silicon wafers W in the wafer boat 12.

The front end portion of the second gas pipe 14 is made of quartz and the base portion 14c thereof of stainless steel. It is introduced into the manifold 4 through a seal member 14b.

$Ph_3$ (or phosphine) including dopant, is used as the doping gas in this first embodiment, but $AsH_3$ (arsine), $Sb_2O_5$ vapor and $B_2H_6$ (diborane) including arsenic, antimony and boron may be used as the doping gas.

Flow rate adjuster valves 15a, 16a and 17a are attached to supply pipes of the gas supply sources 15, 16 and 17, respectively. The output side of a controller 23 is connected to drive power sources for the flow rate adjuster valves 15, 16 and 17. The controller 23 includes a computer system comprising a CPU and memories. Various pieces of information are applied from sensors (not shown) at various sections of the CVD apparatus to the controller 23. When the valves 15a, 16a and 17a are adjusted by the controller 23, therefore, flow rates of film forming and doping gases and the concentration of the doping gas which is diluted by helium gas can be controlled.

An exhaust outlet 19 is formed in the process tube 10 at the lower portion thereof, communicating with the inner and outer cylinders 3 and 2. It is also communicated with an exhaust system 27 via an exhaust pipe 20, which is made of stainless steel.

A pipe 21 is branched from the exhaust pipe 20 upstream the exhaust system 27. This branched pipe 21 is communicated with a pressure detector 22, which is connected to the input side of the controller 23. The output side of the controller 23 is also connected to motor 24 which serves to open and close a valve 25. The valve 25 is located in the exhaust pipe 20 down-stream the branched pipe 21 and it serves to adjust the flow rate of gases exhausted, downstream the branched pipe 21, to the exhaust system 27 through the exhaust pipe 20.

The exhaust system 27 includes a dry pump 28, a burning device 30 and a factory exhaust device 32 from upstream to downstream. The dry pump 28 is of the type which uses no lubricating oil at its rotating and sliding parts. A pod 31 is housed in the burning device 30. The pod 31 has an air intake and $SiH_4$ which is included in waste gas and not reacted yet is reacted and burned with air taken into the pod 31 through the air intake.

Nitrogen gas is supplied from a nitrogen gas supply source (not shown) into the pod 31 to dilute the waste gas with nitrogen gas thus supplied. A tube filled with chemicals for absorbing or decomposing harmful and dangerous components in the waste gas may be used instead of the burning device 30.

The factory exhaust device 32 is intended to collectively process waste gases exhausted through exhaust systems of plural CVD apparatuses. It has therefore an exhaust blower of large capacity.

The flow rate of $N_2$ gas which is used to dilute the waste gas will be described. It is needed in the burning device 30 that the concentration of $SiH_4$ in the waste gas is diluted lower than the explosion limit of $SiH_4$. The amount of $N_2$ gas which is needed to dilute the concentration of $SiH_4$ lower than this limit will be calculated as follows.

It is assumed that the reaction product be deposited only on surfaces of 170 sheets of 6-inch silicon wafers and the inner and outer cylinders 2 and 3. The surface area $A_1$ of all the silicon wafers is about 60010 $cm^2$ and the total surface area $A_2$ of the inner and outer cylinders 2 and 3 is about 20340 $cm^2$. The surface areas $A_1$ and $A_2$ are totaled to 80350 $cm^2$ (which will be denoted by total area A).

It is also assumed that the amount of $SiH_4$ gas, 100% in concentration, supplied be 800 SCCM and that the film forming average speed (D/R) be 35A/min. The volume V of polysilicon film formed per minute is $2.81 \times 10^- cm^3/min$. $(=35 \times 10^{-8} \times A)$. The weight W of polysilicon film deposited per minute thus becomes 6.55/min. $(=V \times \rtimes)$. The density $\rtimes$ of silicon is set 2.33 $g/cm^3$ in this case.

One mol of silicon equals to 28 g. Mols of silicon needed for the polysilicon film deposited therefore becomes $2.34 \times 10^{-3}$ mols/min. (=W/28). When converted into gas, these mols becomes about 52.4 cc/min. (=M×22400).

One molecule of Si can be made by one molecule of $SiH_4$. The amount S of $SiH_4$ consumed therefore becomes 52.4 SCCM. When the amount of $SiH_4$ gas supplied is 800 SCCM, therefore, $SiH_4$ gas of 747.6 SCCM is included in the waste gas. When converted into reaction rate, the reaction rate of $SiH_4$ gas becomes about 6.6%.

The explosion limit of $SiH_4$ is 0.6%. The amount of $N_2$ gas needed to dilute the waste gas in the exhaust system 27 becomes (125SLM +α) accordingly.

It will be described with reference to FIG. 2 how P-added polysilicon film is formed in the above-described CVD apparatus.

The processing region in the process tube 10 is heated by the heaters 6. It is heated to a temperature a little lower than that in the common pressure-reduced CVD apparatus, or preferably to a certain temperature of 575° C., for example, in a temperature range of 550°–600° C. (Step 51).

The boat 12 is loaded into the process tube 10 in such a way that it can be positioned in the equally-heated region (Step 52). 170 sheets of 6-inch silicon wafers W are housed in the boat 12. When the boat 12 is loaded into the process tube 10. the process tube 10 is air-tightly sealed by the cap 7. The wafer boat 12 is then rotated at low speed.

The dry pump of the exhaust system 27 is made operative to exhaust the process tube 10 to 0.001 Torr, for example (Step 53). When signal which represents internal pressure in the process tube 10 is applied to the controller 23, the controller 23 sends, responsive to the signal applied, signals to the valves 15a, 16a and 17a to control them. As the result, $SiH_4$ gas, 100% in concentration, is supplied from the gas supply source 15 into the process tube 10 at a flow rate of 500 SCCM, while diluting mixed gases of phosphine and helium are also supplied from the gas supply sources 16 and 17 into the process tube 10 at a flow rate of 5 SCCM (Step 54). The concentration of phosphine in the diluting mixed gases is about 10 volume %.

It is preferable that the flow rate of film forming $SiH_4$ gas is in a range of 300–5000 SCCM, considering gas supply, exhaust and burn-process capacities of the CVD apparatus. This amount of $SiH_4$ gas supplied is quite larger than that when the doped polysilicon film is formed according to the conventional CVD process. A larger amount of not-reacted silane therefore is included in the waste gas and it must be burned in the burning device 30. The burning device 30 is thus made to have a process capacity quite larger than that of the conventional one.

While supplying process gases into the process tube 10, the exhaust valve 25 is opened and closed to control the internal pressure in the process tube 10 at about 0.4 Torr. The amount of process gases supplied in this case is kept certain during the film forming process. While controlling the internal pressure in the process tube 10 in this manner, the film forming process is carried out (Step 55).

A large amount of $SiH_4$ gas is jetted into the process tube 10 through the open top 13a of the first gas pipe 13. The process tube 10 is thus filled with $SiH_4$ gas. A film formed on the surface of each wafer, therefore, is more excellent in the uniformity of thickness on each wafer. In addition, P-dopes are uniformly supplied to each silicon wafer W through the plural holes 14a of the second gas pipe 14. The film formed, therefore, is also more excellent in the uniformity of the same thicknesses on the wafers w and in the uniformity of the same dope concentrations in the films on the wafers W. After the lapse of a certain time, the valves 15a, 16a and 17a are closed to stop the supply of gases into the process tube 10 (Step 56).

The wafer boat 12 is stopped and all of waste gas is exhausted from the process tube 10 (Step 57). Nitrogen gas is then supplied into the process tube 10. The process tube 10 is thus purged with nitrogen gas. The wafer boat 12 is unloaded out of the process tube 10 (Step 58).

FIG. 3 is a graph showing how flow rates and amounts of $PH_3$ and $SiH_4$ are related to the film forming speed, in which the flow rate and amount of $PH_3$ relative to those of $SiH_4$ are plotted on the horizontal axis and the film forming speed on the vertical axis. Film forming conditions were that the internal pressure in the process tube was 0.6 Torr, the wafer rotating speed 3 rpm, the pitch interval between the two adjacent wafers in the wafer boat 12 4.762 mm, the flow amount of $SiH_4$ gas, 100% in concentration, 800 SCCM, and temperature in the process tube 10 575° C. The flow amount of $PH_3$, 1% in concentration, was variously changed in a range of 130–190 SCCM.

As apparent from FIG. 3, the film forming speed becomes lower as the flow amount of $PH_3$ gas increases.

FIG. 4 is a graph showing how flow rates and amounts of $PH_3$ and $SiH_4$ are related to P-concentration in the film formed, in which the flow rate and amount of $PH_3$ relative to those of $SiH_4$ are plotted on the horizontal axis and the P-concentration in the film formed on the vertical axis. Film forming conditions were same as in FIG. 3.

As apparent from FIG. 4, the P-concentration in the film formed becomes higher as the flow amount of $PH_3$ gas increases.

FIG. 5 is a graph showing how flow rates and amounts of $PH_3$ and $SiH_4$ are related to the resistivity of the film formed, in which the flow rate and amount of $PH_3$ relative to those of $SiH_4$ are plotted on the horizontal axis and the resistivity of the film formed on the vertical axis. Film forming conditions were same as in FIG. 3.

As apparent from FIG. 5, the resistivity of the film formed become minimum when the flow amount of 1% $PH_3$ gas is 150 SCCM. Therefore, the best result can be obtained when the flow amount of $PH_3$ gas is in a range of 130–170 SCCM (or the flow rate of $PH_3$ relative to that of $SiH_4$ is in a range of $1.625$–$2.125 \times 10^{-3}$) while setting the flow amount of $SiH_4$ gas at 800 SCCM.

FIG. 6 is a graph showing the relation between film forming temperature and speed (A/minute), in which the film forming temperature is plotted on the horizontal axis and the film forming speed on the vertical axis. Film forming conditions were that the internal pressure was 0.6 Torr, the number of 6-inch silicon wafers processed 170 sheets, the pitch interval between the two adjacent wafers in the boat 12 4.762 mm, the flow amount of $SiH_4$ gas, 100% in concentration, 800 SCCM, the flow amount of $PH_3$ gas, 1% in concentration, 150 SCCM, the flow amount of pure $N_2$ gas 100 SCCM and the film processing time 901 minutes. Temperature in the process tube was variously changed in a range of 570°–580° C. A curve to which circles are appended represents results obtained about the wafer located eleventhly from the bottom of the wafer boat 12, a triangles-attached curve results obtained about the 86th wafer, and a rectangles-attached curve results obtained about the 160th wafer. Ten sheets of wafers at the top of the boat 12 and those at the bottom thereof were dummies.

As apparent from FIG. 6, the film forming speed becomes higher as the temperature rises.

FIG. 7 is a graph showing the relation between the film forming temperature and the P-concentration in the film formed. in which the film forming temperature is plotted on the horizontal axis and the P-concentration in the film formed on the vertical axis. Film forming conditions were same as in FIG. 6.

As apparent from FIG. 7, the P-concentration in the film formed is hardly influenced even when the temperature is variously changed.

FIG. 8 is a graph showing the relation between the film forming temperature and the sheet resistivity (ohm/□) of the film formed, in which the film forming temperature is plotted on the horizontal axis and the sheet resistivity of the film formed on the vertical axis. Film forming conditions were same as in FIG. 6.

As understood from FIG. 8, the sheet resistivity of the film formed becomes smaller as the temperature rises.

Figure 9:
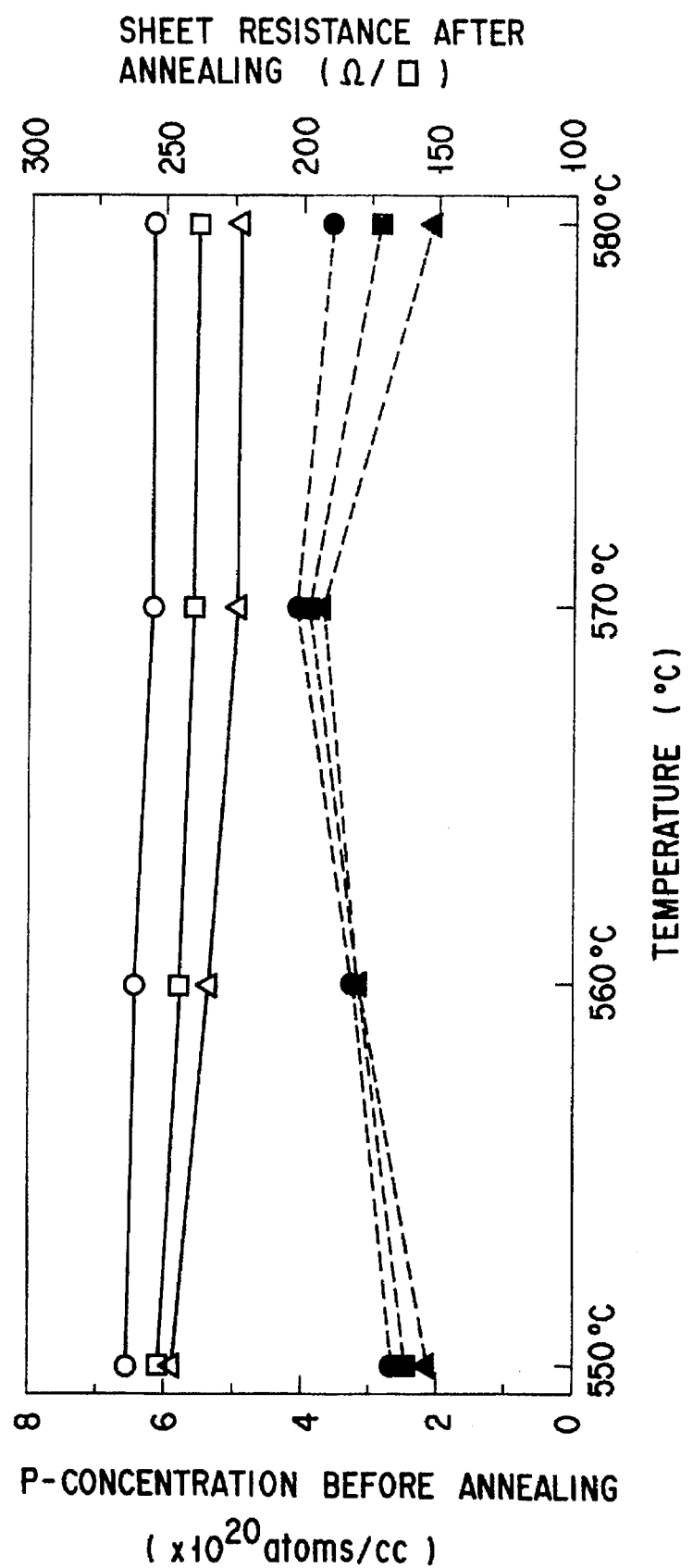
FIG. 9 is a graph showing how the P-density and the sheet resistance in film before and after the annealing process are influenced when the processing temperature is variously changed.

FIG. 9 is a graph showing how the film forming temperature is related to the P-concentration in the film formed before the annealing process and the sheet resistivity of the film formed after the annealing process, in which the film forming temperature is plotted on the horizontal axis and the P-concentration in the film formed before the annealing process and the sheet resistivity of the film formed after the annealing process on the vertical axis. The film thickness was fixed to 1000 Å. The annealing condition was held at 850° C. and for one hour. White circles-, rectangles- and triangles-attached curves represent P-concentrations in films formed before the annealing process on 11th, 86th and 160th wafers counted from the bottom of the wafer boat 12. Black circles-, rectangles- and triangles-attached curves denote sheet resistivities of films formed after the annealing process on 11th, 86th and 160th wafers.

As understood from FIG. 9, the P-concentration in the film formed hardly depends upon the temperature but the sheet resistivity of the film formed greatly depends upon it.

Figure 10:
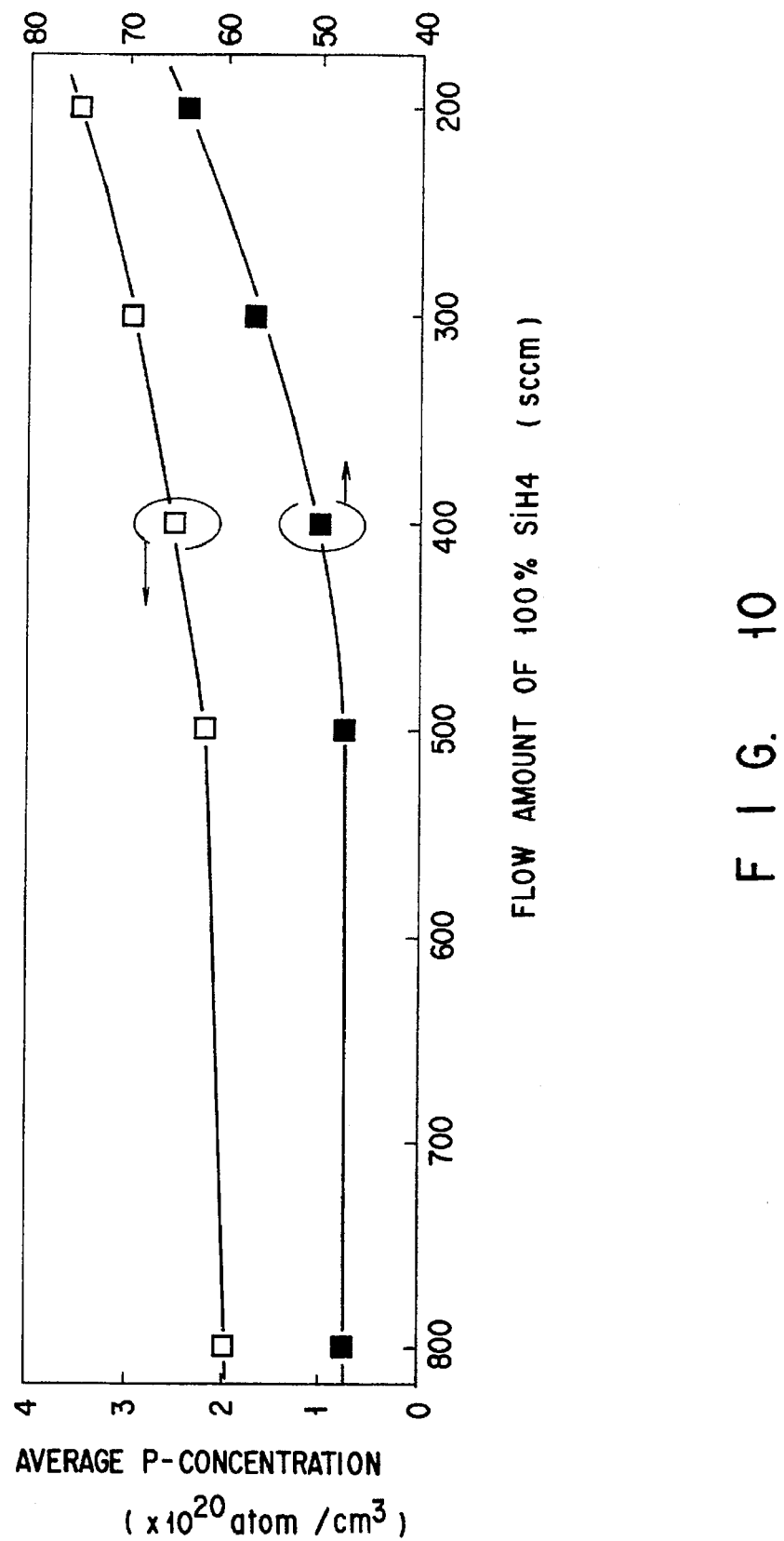
FIG. 10 is a graph showing how the P-density in film formed depends upon the flow rate of silane gas changed when P-added polysilicon film is to be formed.

FIG. 10 is a graph showing how the flow amount of $SiH_4$, 100% in concentration, is related to the average P-concentration in the film formed and the uniformity of the same P-concentrations in films formed on the wafers, in which the amount of $SiH_4$ is plotted on the horizontal axis and the average P-concentration in the film formed and the uniformity of the same P-concentrations in films formed on the wafers on the vertical axis. Film forming conditions were that the internal pressure was 0.4 Torr, the temperature 575° C., and the flow amount of diluting $PH_3$, 10% in concentration, 5 SCCM. The flow amount of $SiH_4$, 100% in concentration, was variously changed. A white rectangles-attached curve represents average P-concentrations in the film and a black rectangles-attached curve uniformities of P-concentrations in films on the wafers.

As apparent from FIG. 10, excellent results ranging from a value smaller than 10% to a value of 10% could be obtained about the uniformity of the same thicknesses of films formed on the wafers. A value of around $2.2 \times 10^{20}$ particles/$cm^3$ could be obtained about the P-concentration in the film formed. The uniformity of P-concentrations in films formed on the wafers was allowed to have a value of about 50% and this was better than the P-concentration in the film formed.

Figure 11:
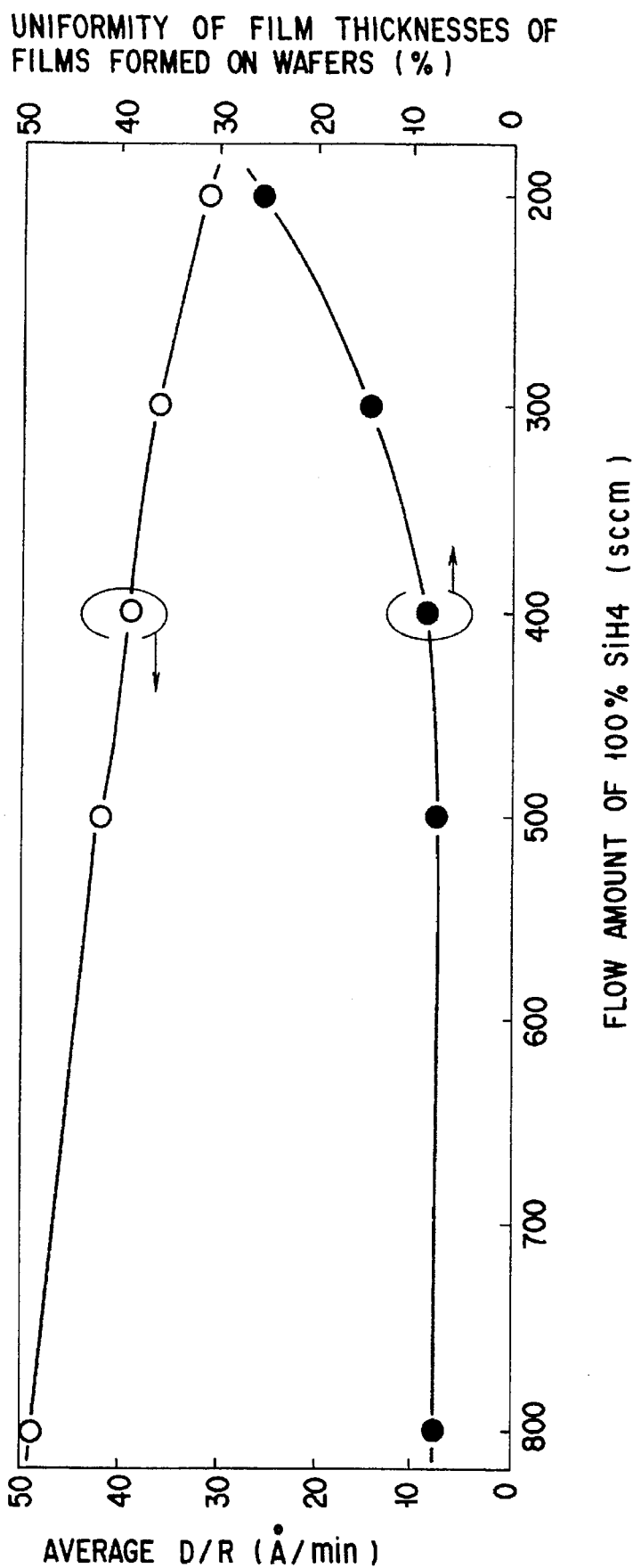
FIG. 11 is a graph showing how the film forming average speed depends upon the flow rate of silane gas changed when P-added polysilicon film is to be formed.

FIG. 11 is a graph showing how the flow amount of $SiH_4$, 100% in concentration, is related to the film forming speed and the uniformity of the same thicknesses of films formed on the wafers, in which the flow amount of $SiH_4$ is plotted on the horizontal axis and the film forming speed and the uniformity of the same thicknesses on the vertical axis. The film forming conditions were same as in FIG. 10. A white rectangles-attached curve represents average film forming speeds and a black rectangles-attached curve uniformities of the same thicknesses of films formed on the wafers.

As apparent from FIG. 11, the uniformity of the same thicknesses of films formed on the wafers become a value of about 10% or smaller than 10%. The film forming speed could have a value larger than 40 Å/min. when the flow amount of $SiH_4$ was 500 SCCM.

Referring to FIGS. 10 and 11, it will be studied how the P-added polysilicon film formed depends upon the flow amount of silane.

The conventional P-added polysilicon film forming process was carried out at a flow amount of 100% silane than 200 SCCM and at a reaction temperature of about 630° C. According to the embodiment of the present invention, however, the average film forming speed increases from about 30 Å/min. to about 42 Å/min. as the flow amount of $SiH_4$ is increased from 200 SCCM to 500 SCCM. This enables the throughput of the apparatus to be enhanced. The uniformity of the same thicknesses of films formed on the wafers can be lowered from about 25% to about 8%, thereby enabling the quality of the wafers to be made more excellent. Further, more excellent results could be obtained about the uniformity of the same P-concentrations in films formed on the wafers and about the average P-concentration in the film formed. Because the uniformity of the same P-concentrations in films formed on the wafers could be lowered from about 65% to about 48% as the amount of $SiH_4$ supplied was increased.

When the P-added polysilicon film forming process is to carried out, the reaction temperature can be made lower and the amount of $SiH_4$ supplied can be increased to a greater extent as described above. The film forming speed can be thus made higher and both of the uniformity of the same thicknesses of films formed on the wafers and the uniformity of the same dope concentrations in films formed on the wafers can be enhanced.

FIGS. 12 through 14 are graphs showing how wafers numbered from the bottom of the boat 12 is related to the film forming speed, the P-concentration in the film formed, the sheet resistivity of the film formed, and the uniformity of the same thicknesses of films formed on the wafers. The wafers numbered are plotted on the horizontal axis and the film forming speed, the P-concentration, the sheet resistivity and the uniformity of the same thicknesses are plotted on the vertical axes in FIGS. 12 through 14. The film forming condition was that the flow amount of diluting $PH_3$, 1% in concentration, was 150 SCCM. A white circles-attached curves represent results obtained about the film forming speed, the P-concentration and the sheet resistivity. A white rectangles-attached curves denote results obtained about the uniformity of the same thicknesses of films formed on the wafers.

As seen in FIGS. 12 through 14, the film forming speed on the numbered wafers is a relatively large value of about 33 Å/min. and the uniformity of the same thickness of the film formed on each wafer is a more excellent value smaller than about ±1% in this embodiment, although it was about ±4% in the case of the conventional method. In addition, the P-concentration is a more excellent value of about $5-6 \times 10^{20}$ Darticles/$cm^3$ and the uniformity of film thickness of the film formed on each wafer is in a range of about 0.5–1.5%. Further, the sheet resistivity of films formed after the annealing process is in a range of about ±30–35 (ohms/□) and the uniformity of film thickness of the film formed on each wafer is in range of about ±2–3.5%. This shows that relatively excellent results could be obtained about the uniformity of the same thicknesses of films formed on the wafers as well as the uniformity of the same thickness of the film formed on each wafer.

Figure 15:
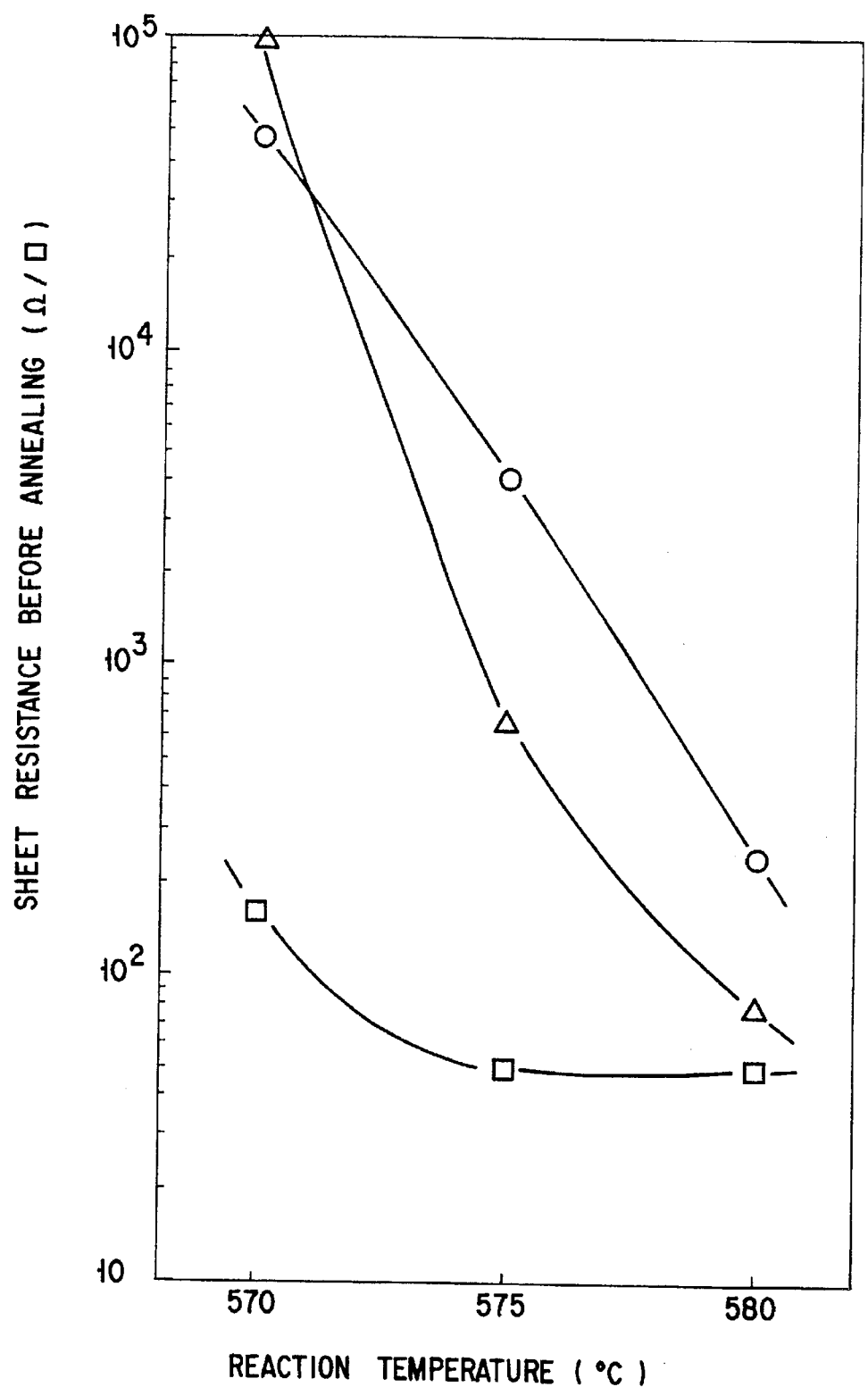
FIG. 15 is a graph showing how the sheet resistance of film before the annealing process depends upon the processing temperature changed when P-added polysilicon film is to be formed.

FIG. 15 is a graph showing how the reaction temperature is related to the sheet resistivity of the film formed before the annealing process, in which the reaction temperature is plotted on the horizontal axis and the sheet resistivity on the vertical axis. The film forming conditions were that the internal pressure was 0.6 Torr, the flow amount of silane, 100% in concentration, 800 SCCM, the flow amount of helium-diluting phosphine, 1% in concentration, 150 SCCM, the reaction temperature was successively changed from 570° C. to 580° C. and the film forming process was carried out for 90 minutes.

As seen in FIG. 15, the sheet resistivity (ohms/□) of the film formed on the 160th wafer was extremely small in value but those of films formed on the 11th and 86th wafers were extremely large in value at a reaction temperature of 570° C. In other words, they were quite different in value. When the reaction temperature is raised to 580° C., however, they become substantially same in value, thereby enabling the uniformity of the same thicknesses of films formed on the wafers to be made more excellent.

Although the case where the P-dope is used has been described in the above embodiment, boron, arsenic and antimony can also be used as the dope.

The oxidation diffusion apparatus, the CVD apparatus, the plasma CVD apparatus and others can also be used as the heat process one.

Further, the glass substrate and others can also be used as the matter to be processed.

According to the method of the present invention, the amount of film forming gas supplied is set in a range of about 300–5000 SCCM and the reaction temperature in a range of about 550°–600° C. when a doped thin film is to be formed on the wafers. Therefore, the film forming speed can be increased to a far greater extent and uniformities of the same thickness and dope concentration of and in the film formed on each wafer can be enhanced. In addition, uniformities of the same thicknesses and dope concentrations of and in films formed on the wafers can also be enhanced.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of forming a doped film on a substrate, said doped film having improved uniformity of thickness on said substrate and an improved homogeneity of dopant in said film, which comprises:

a) assembling a process tube, means for supplying a film forming gas into the process tube, means for supplying doping gas into the process tube, pump means for exhausting the process tube, and means for burning any unreacted elements in a waste gas from the method;

b) arranging a plurality of substrates in the process tube;

c) exhausting the process tube to maintain reduced pressure;

d) heating the plurality of substrates in the process tube to a temperature range of 500°–600° C.;

e) introducing the doping and filming forming gases into the process tube, while exhausting the process tube, a flow rate ratio of said dopant gas to said film forming gas ranging between $1.625 \times 10^{-3}$ to $2.125 \times 10^{-3}$, and a flow amount of the film forming gas of 48 to 807 SCCM/m$^2$ being supplied to a unit surface area of each substrate, said film forming gas being SiH$_4$ and said doping gas comprising PH$_3$ in an amount of 1±0.1% by volume in an inert gas; and f) decomposing said film forming gas and said doping gas into Si components and P components by heat, and uniformly adsorbing the Si components and the P components on an entire surface of each of the substrates by hindering the P components from being deposited on a peripheral portion at each of the substrates earlier than the Si components, thereby improving uniformity of thickness of inter-films formed on the substrates, uniformity of thickness of a film formed on the substrate, uniformity of impurity concentrations of inter-films formed on the substrates, and uniformity of impurity concentration of a film formed on the substrate.

2. The doped film forming method according to claim 1, wherein 300–5000 SCCM of the SiH$_4$ gas is supplied to 170 silicon wafers whose diameters are 6 inches each.

3. The doped film forming method according to claim 1, wherein the speed at which the polysilicon film including the dope is formed is 30 Å/min or more.

4. The doped film forming method according to claim 1, wherein the internal pressure of the process tube is set within the range of 0.4–0.6 torr, when the gases are supplied to the process tube.

5. The doped film forming method according to claim 1, further comprising the steps of preparing the burning means and burning unreacted gases included in the gas exhausted from the process tube by means of the burning means.

6. The doped film forming method according to claim 1, wherein the wafers are rotated while the gases are being supplied to the process tube.

7. The doped film forming method according to claim 1, wherein the gases are introduced from a lower portion of the process tube.

8. The doped film forming method of claim 1, wherein the dispersion of film thickness is within a range of ±1% upon film forming and within a range of ±2 to 3.5% after annealing and a P concentration of the formed film is within a range of 5 to $6 \times 10^{20}$ particles/cm$^3$.

* * * * *